(12) United States Patent
Pramanik et al.

(10) Patent No.: US 9,297,067 B2
(45) Date of Patent: *Mar. 29, 2016

(54) FLUORINE PASSIVATION OF DIELECTRIC FOR SUPERCONDUCTING ELECTRONICS

(71) Applicant: Intermolecular, Inc., San Jose, CA (US)

(72) Inventors: Dipankar Pramanik, Saratoga, CA (US); Andrew Steinbach, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 222 days.

This patent is subject to a terminal disclaimer.

(21) Appl. No.: 14/137,320

(22) Filed: Dec. 20, 2013

(65) Prior Publication Data

US 2015/0179913 A1 Jun. 25, 2015

(51) Int. Cl.

| | | |
|---|---|---|
| *C23C 14/14* | (2006.01) | |
| *C23C 14/58* | (2006.01) | |
| *H01L 23/532* | (2006.01) | |
| *H01L 21/768* | (2006.01) | |
| *H01L 27/18* | (2006.01) | |

(52) U.S. Cl.
CPC ............. *C23C 14/5806* (2013.01); *C23C 14/14* (2013.01); *H01L 21/76826* (2013.01); *H01L 23/5329* (2013.01); *H01L 27/18* (2013.01); *H01L 23/53285* (2013.01); *Y10T 428/265* (2015.01)

(58) Field of Classification Search
CPC ....... H04L 39/24; H04L 39/12; H04L 39/249; C23C 14/14; C23C 14/5806
See application file for complete search history.

(56) References Cited

U.S. PATENT DOCUMENTS

| | | |
|---|---|---|
| 5,753,564 A | 5/1998 | Fukada |
| 2010/0003833 A1 | 1/2010 | Tsuji et al. |

OTHER PUBLICATIONS

Pi et al; Fluorine in Silicon: Diffusion, Trapping, and Precipitation; Apr. 17, 2003; Physical Review Letters, vol. 90, No. 15; The American Physical Society; pp. 155901-1-155901-4.

Burin et al; Universal Dielectric Loss in Glass from Simultaneous Bias and Microwave Fields; Apr. 8, 2013; Physical Review Letters; The American Physical Society; pp. 157002-1-157002-5.

*Primary Examiner* — Colleen Dunn

(57) ABSTRACT

An amorphous silicon (a-Si) dielectric for superconducting electronics is fabricated with reduced loss tangent by fluorine passivation throughout the bulk of the layer. Complete layers or thinner sub-layers of a-Si are formed by physical vapor deposition at low temperatures (<350 C, e.g. ~200 C) to prevent reaction with superconducting materials, then exposed to fluorine. The fluorine may be a component of a gas or plasma, or it may be a component of an interface layer. The fluorine is driven into the a-Si by heat (e.g., <350 C) or impact to passivate defects such as dangling bonds.

20 Claims, 6 Drawing Sheets

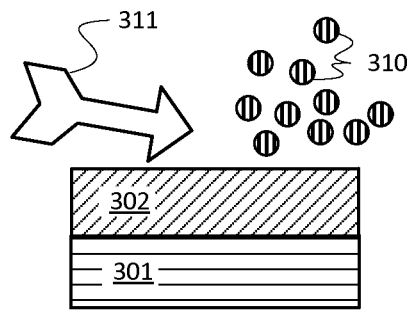
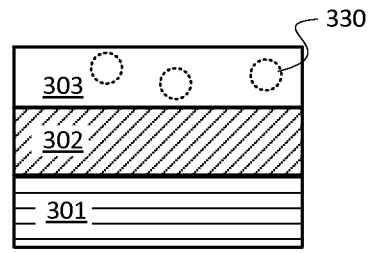
FIG. 3A  FIG. 3B
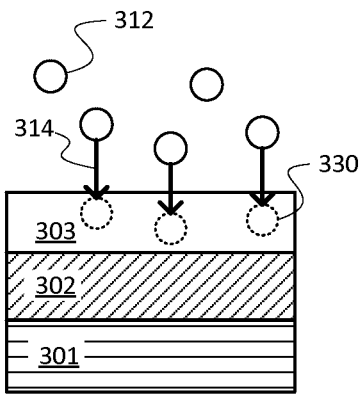
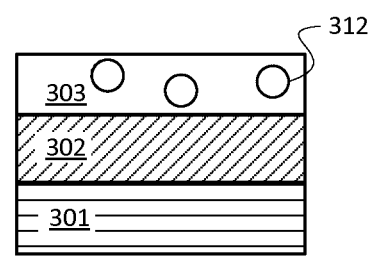
FIG. 3C  FIG. 3D
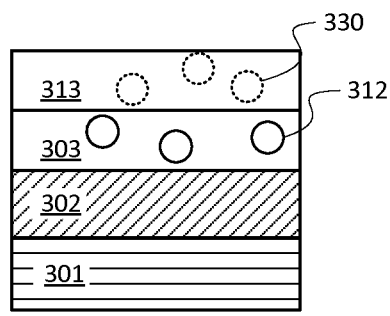
FIG. 3E

FLUORINE PASSIVATION OF DIELECTRIC FOR SUPERCONDUCTING ELECTRONICS

BACKGROUND

Related fields include thin-film microwave devices with superconducting components and passivation processes for dielectrics.

At temperatures <100 mK, amorphous silicon (a-Si) is a dielectric. Its low cost and ease of fabrication make it attractive as an interlayer dielectric (ILD) for superconducting interconnects and components for planar microwave devices, but its loss tangent (~$10^8$) is much larger than that of single-crystal Si (~$10^7$) at microwave frequencies (e.g., 3-300 GHz) and longer infrared frequencies (300-1000 GHz). The loss tangent is believed to be caused by defects occurring during deposition. A lower loss tangent would benefit high-frequency classical devices by reducing signal attenuation, dispersion and jitter. A lower loss tangent would benefit quantum devices, such as rapid single flux quantum (RFSQ) circuits and reciprocal quantum logic (RQL) by increasing coherence times for quantum state signals.

Crystalline dielectrics are observed to have lower loss tangents than their amorphous counterparts. However, crystallization of interlayer dielectrics for superconducting circuits typically requires temperatures high enough to cause unwanted reactions between the dielectric and the wiring materials (e.g., Al or Nb). Hydrogenation has been observed to improve a-Si loss tangent in some cases. However, ILD layers are typically 300-1000 nm thick. At this thickness, many surface treatments are ineffective to remove defects from the bulk of the film. This is also an inconvenient thickness to form by the precisely controlled methods of atomic layer deposition (ALD); each ALD cycle creates a monolayer on the order of 0.1 nm thick, therefore a layer hundreds of nm thick would take too long to be cost-effective.

Therefore, a need exists for methods to reduce the microwave-frequency loss tangent of a-Si films by reducing or eliminating defects in the bulk of micron-scale films as well as on the surface.

SUMMARY

The following summary presents some concepts in a simplified form as an introduction to the detailed description that follows. It does not necessarily identify key or critical elements and is not intended to reflect a scope of invention.

Embodiments of superconducting circuits include an a-Si ILD passivated with fluorine (F) throughout its bulk as well as at its interfaces. The ILD is deposited and fluorine-treated at temperatures less than 350 C, or in some embodiments less than 200 C, to protect the superconducting wiring materials and prevent them from reacting with the ILD.

In some embodiments, sub-layers of the a-Si may be deposited and alternated with fluorine treatments of each sub-layer. The a-Si may be deposited by physical vapor deposition (PVD) and fluorine-treated in the same chamber or in a different chamber. The sub-layer fluorine treatments may include plasma, carrier gas, or formation of an F-containing film or adsorbed layer followed by low-temperature annealing (<350 C).

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

FIGS. 3A-3E conceptually illustrate fluorine incorporation into sub-layers from a plasma or carrier gas.

DETAILED DESCRIPTION OF EXAMPLE EMBODIMENTS

Figure 1A:
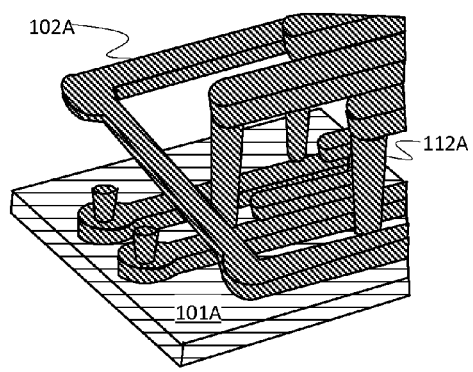
FIGS. 1A and 1B conceptually illustrate interconnects and interlayer dielectrics.

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) by default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially" contemplates up to 5% variation.

"Substrate," as used herein, may mean any workpiece on which formation or treatment of material layers is desired. Substrates may include, without limitation, silicon, germanium, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

As used herein, a material (e.g. a dielectric material or an electrode material) will be considered to be "amorphous" if it exhibits less than or equal to 20% crystallinity as measured by a technique such as x-ray diffraction (XRD). "Interlayer dielectric," "intermetallization dielectric," "bulk insulator," and "fill dielectric" are used interchangeably herein for an insulating dielectric layer that fills spaces between conducting interconnects (e.g., wiring layers, vias) or between the devices connected by the interconnects. Material properties such as "conductor," "superconductor," "semiconductor," "dielectric," and "insulator" may vary with temperature for a given material, and shall be used herein to describe the characteristics of the materials at the intended operating temperature of the device in which the materials are used. For example, "forming a superconducting layer" shall mean "forming a layer of a material expected to exhibit superconductivity at the intended operating temperature of the device being fabricated."

As used herein, "controlled atmosphere" and "controlled environment" are equivalent and refer to a vacuum or inert-gas environment. Examples of inert gases include noble gases (helium, neon, argon, krypton, xenon) and, unless the text or context excludes it (e.g., by describing nitride formation as undesirable), nitrogen. An "oxygen-free" environment shall mean less than 0.1 vol % oxygen.

Figure 1B:
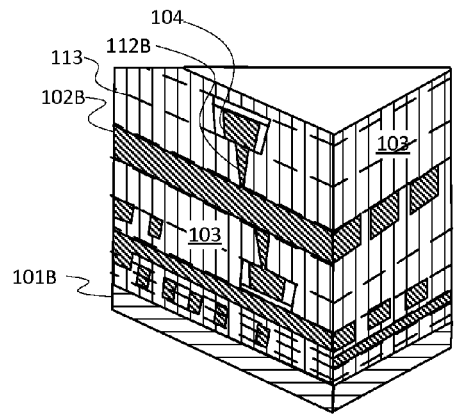

FIGS. 1A and 1B conceptually illustrate interconnects and interlayer dielectrics. FIG. 1A illustrates multiple layers of interconnects without showing the ILD, to better visualize the three-dimensional network of wirings 102a and vias 112A built up on substrate 101A. Substrate 101A may have other layers and structures below those shown. Typically, each wiring 102A begins as a blanket conductive layer formed on an ILD layer. The blanket layer is etched to form the separate conductive paths, and the resulting wiring is buried in another ILD layer. Vias 112A may be constructed similarly to wirings 102A, or alternatively they may be constructed by patterning the ILD; forming openings through the ILD and filling the openings with conductive material. Longer vias that penetrate more than one layer may be constructed as multiple segments, with the length of each segment being the thickness of one layer. Some formations may involve chemical-mechanical polishing (CMP) of either an ILD layer or a conductive layer to expose parts of buried structures. In superconducting microwave devices, the conductive elements (wirings and vias) may be any suitable superconducting material, such as aluminum (Al), niobium (Nb), Nb alloys, Nb nitride, ceramic superconductors, or organic superconductors.

FIG. 1B is a schematic cutaway view of several interconnect and device layers. Here, the ILD 103 is shown between the structures; heavy dotted lines 113 delineate the separately formed layers. The illustrated structures include some wirings 102B and vias 112B, and also some components 104 (e.g., transistors, capacitors, switches, resistors, resonators; in a superconducting device, the components may include Josephson junctions).

Figure 2:
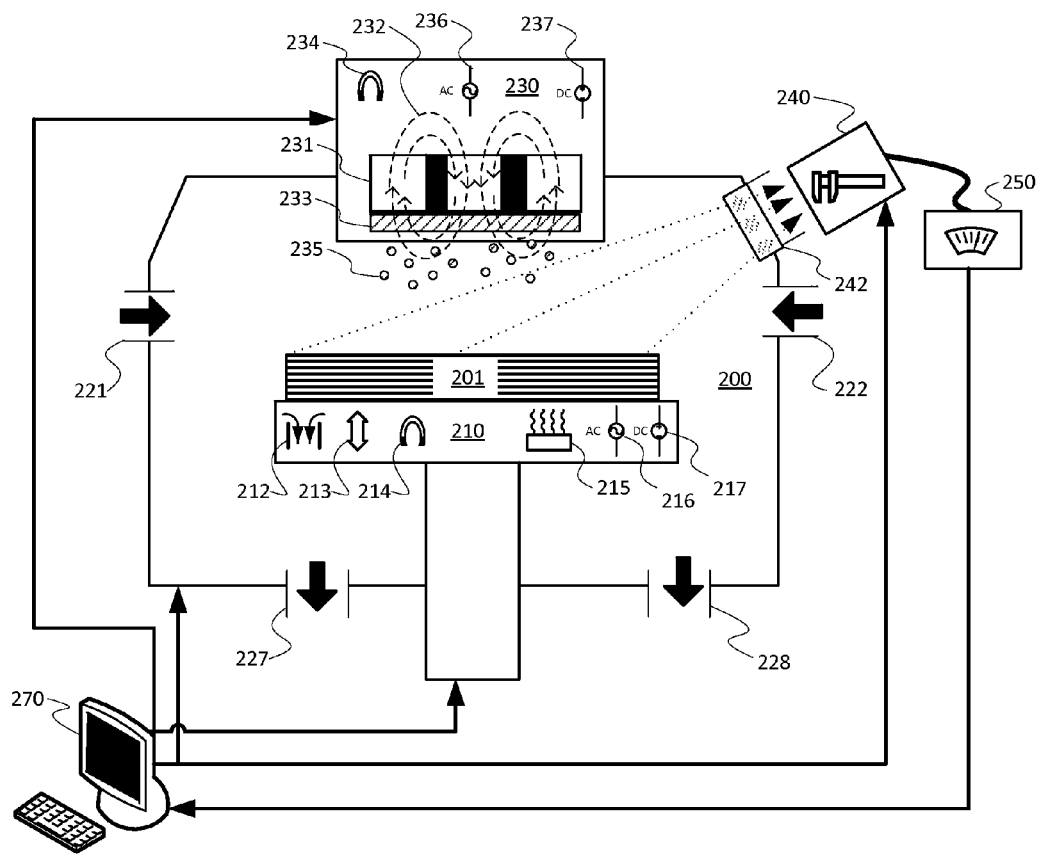
FIG. 2 is a block diagram of an example PVD

FIG. 2 is a block diagram of an example PVD apparatus. Chamber 200 includes a substrate holder 210 for holding a substrate 201. Substrate holder 210 may include a vacuum chuck 212, translation or rotational motion actuators 213, a magnetic field generator 214, a temperature controller 215, and circuits for applying an AC voltage bias 216 or DC voltage bias 217 to substrate 201. Some chambers include masks (not shown) for exposing only part of substrate 201 to the PVD process. The masks may be movable independent of the substrate. Chamber 200 includes inlets 221, 222 and exhausts 227, 228 for process gases. Process gases for PVD may include inert gases such as nitrogen or argon, and may also include reactive gases such as hydrogen or oxygen.

Chamber 200 includes least one sputter gun 230 for sputtering elementary particles 235 (such as atoms or molecules) from a sputter target 233 by means of plasma excitation from the electromagnetic field generated by magnetron 231. Sputter gun 230 may include adjustments for magnetic field 234, AC electric field 236, or DC electric field 237. Some sputter guns 230 are equipped with mechanical shutters (not shown) to quickly start or stop the exposure of substrate 201 to elementary particles 235. Some PVD chambers have multiple sputter guns.

Some chambers 200 support measuring equipment 240 that can measure characteristics of the substrate 201 being processed through measurement ports 242. Results for measuring equipment 240 may be monitored by monitoring equipment 250 throughout the process, and the data sent to a controller 270, such as a computer. Controller 270 may also control functions of substrate holder 210, chamber 200 and its gas inlets and outlets 221, 222, 227, and 228, sputter gun 230, and measurement equipment 240.

FIGS. 3A-3E conceptually illustrate fluorine incorporation into sub-layers from a plasma or carrier gas. In FIG. 3A, first superconducting layer 302 is formed on substrate 301, which may have additional underlying layers and/or structures. The exposed top surface of first superconducting layer 302 may be a blanket surface over the entire substrate, or may be a patterned structure (e.g., a wiring layer or one or more device contacts). One or more pre-treating agents, symbolized by arrow 311, removes etch residues, native oxides, or any other contaminants 310 from the exposed top surface of first superconducting layer 302. Afterward, the chamber may be purged.

In FIG. 3B, first a-Si layer 303 is deposited over first superconducting layer 302. Optionally, first a-Si layer 303 may also contain H. First a-Si layer 403 may be deposited by PVD at a process temperature less than 350 C, or in some embodiments less than 200 C. First a-Si layer 303 may include a few defects 310, such as dangling bonds.

In FIG. 3C, the substrate is exposed to a gas or plasma with a composition that includes fluorine 312. For example, the plasma may include F ions or F* radicals, or the gas may include $NF_3$ or $F_2$. (For clarity, other components of the gas or plasma are not shown). Fluorine 312 is incorporated into first a-Si layer 303 by some incorporating process 314. Incorporation process 314 is the mechanism (e.g., impacts, heating) that enables fluorine 312 to penetrate first a-Si layer 303, where it may satisfy dangling bonds or passivate other types of defects. The penetration depth of the incorporated fluorine may extend 40 nm or more into the bulk of first a-Si layer 303. In FIG. 3D, fluorine 312 has occupied the former sites of defects 330, reducing the loss tangent of first a-Si layer 303. For example, the loss tangent may be less than 0.0002 at 200 GHz at an operating temperature of 0.1 Kelvin.

In FIG. 3E, if the fluorine-passivated first a-Si layer 303 is thinner than the desired ILD thickness, second a-Si layer 313 is deposited over first a-Si layer 303. Second a-Si layer 413 may be deposited by PVD at a process temperature less than 350 C, or in some embodiments less than 200 C. Optionally, second a-Si layer 313 may also contain H. Second a-Si layer 313 may include a few defects 310, such as dangling bonds. The fluorine exposure and incorporation of FIGS. 3C and 3D may be repeated for second a-Si layer 313, and more a-Si layers may be formed and fluorine-treated until the desired ILD thickness (e.g., 300-1000 nm) is reached.

Figure 4A:
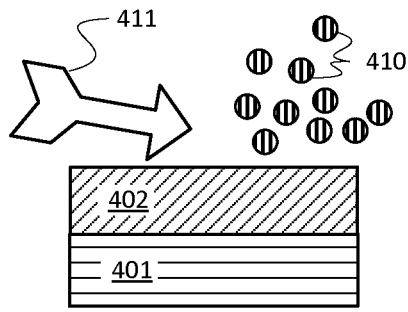
FIGS. 4A-4F conceptually illustrate fluorine incorporation into sub-layers by thermal diffusion from a fluorine-containing layer.

FIGS. 4A-4F conceptually illustrate fluorine incorporation into sub-layers by thermal diffusion from a fluorine-containing layer. In FIG. 4A, first superconducting layer 402 is formed on substrate 401, which may have additional underlying layers and/or structures. The exposed top surface of first superconducting layer 402 may be a blanket surface over the entire substrate, or may be a patterned structure (e.g., a wiring layer or one or more device contacts). One or more pre-treating agents, symbolized by arrow 411, removes etch residues, native oxides, or any other contaminants 410 from the exposed top surface of first superconducting layer 402. Afterward, the chamber may be purged.

Figure 4B:
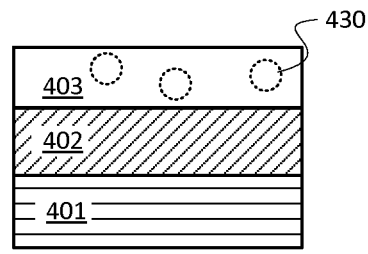

In FIG. 4B, first a-Si layer 403 is deposited over first superconducting layer 402. Optionally, first a-Si layer 403 may also contain H. First a-Si layer 403 may be deposited by PVD at a process temperature less than 350 C, or in some embodiments less than 200 C. First a-Si layer 403 may include a few defects 410, such as dangling bonds. In FIG.

4C, a first interface layer 423, with a composition that includes fluorine 412, is formed on first a-Si layer 403. (For clarity, other components of first interface layer 423 are not shown). First interface layer 423 may be formed by CVD or ALD using a fluorine precursor (e.g., $NF_3$), sputtered from a target in the presence of a fluorine-containing process gas, or adsorbed to the surface of first a-Si layer 403, e.g., from a soak in fluorine-containing gas. First interface layer 423 may be 0.1-10 nm thick. In FIG. 4D, if the fluorine-passivated first a-Si layer 403 is thinner than the desired ILD thickness, second a-Si layer 413 is deposited over first interface layer 423. Second a-Si layer 413 may be deposited by PVD at a process temperature less than 350 C, or in some embodiments less than 200 C. Optionally, second a-Si layer 413 may also contain H. Second a-Si layer 403 may include a few defects 410, such as dangling bonds.

Figure 4C:
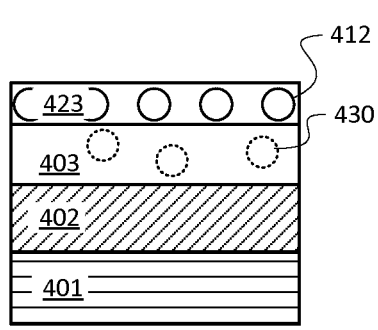
Figure 4D:
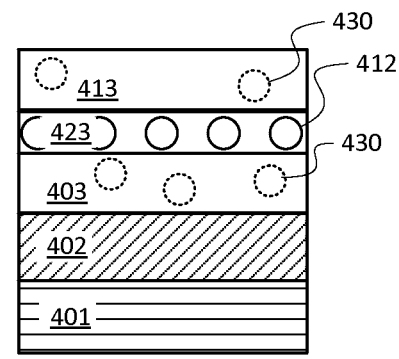
Figure 4E:
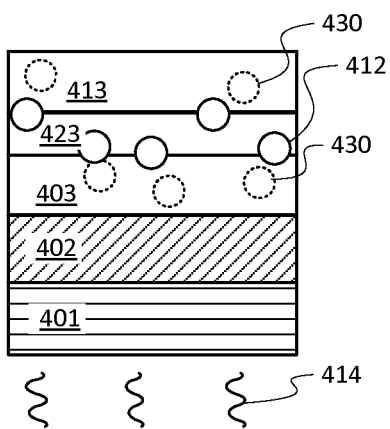
Figure 4F:
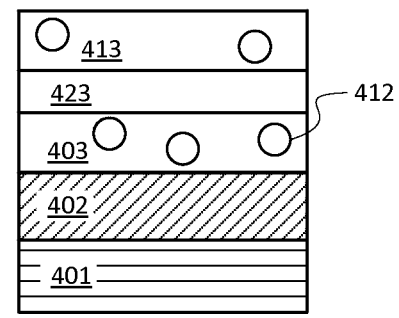

In FIG. 4E, substrate 401 and its various layers and structures are subjected to heat 414. Heat 414 may be applied after each interface layer is formed, after each a-Si layer is formed over an interface layer, or after all the desired a-Si layers and interface layers have been formed. Depending on the composition of first superconducting layer 402 and any underlying layers or structures, the substrate temperature may be kept at less than about 350 C during the heating to prevent reactions between the a-Si and those layers or structures. Heat 414 causes fluorine 412 to diffuse out of first interface layer 423 and into first a-Si layer 403 and, if present, second a-Si layer 413. The penetration depth of the incorporated fluorine may extend 40 nm or more into the bulk of first a-Si layer 403 and/or second a-Si layer 413. In FIG. 4F, fluorine 412 has occupied the former sites of defects 430, reducing the loss tangent of first a-Si layer 403. For example, the loss tangent may be less than 0.0002 at 200 GHz at an operating temperature of 0.1 Kelvin.

The formation of a-Si layers and interface layers of FIGS. 4C and 4D may be repeated until a stack of the desired ILD thickness (e.g., 300-1000 nm) is formed. Heating as in FIG. 4E may be repeated multiple times during the formation of the stack, or performed once after the stack is complete.

Figure 5:
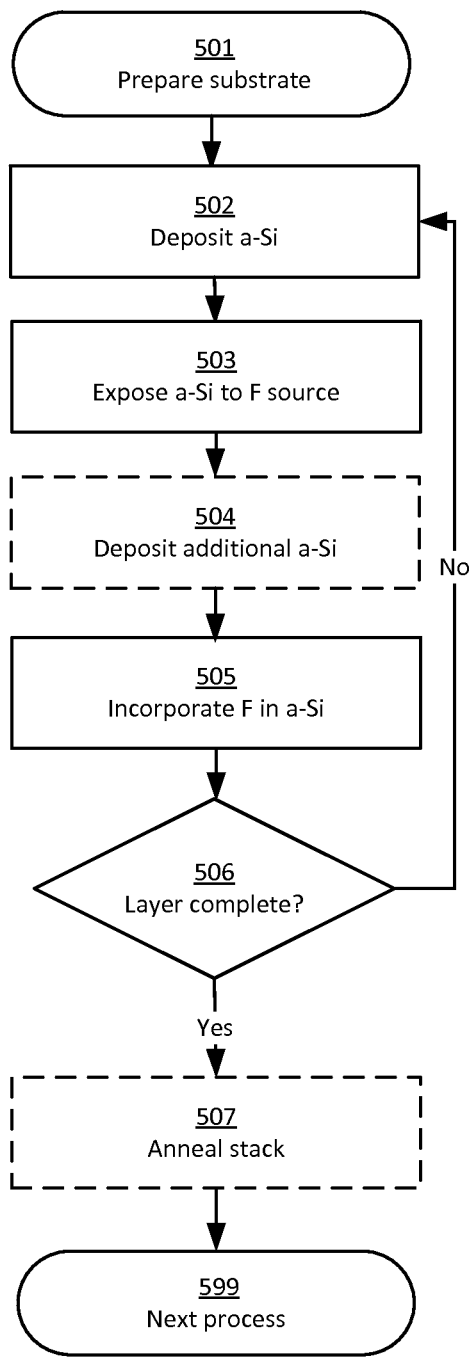
FIG. 5 is a flowchart of an example process for forming a fluorine-passivated ILD layer.

FIG. 5 is a flowchart of an example process for forming a fluorine-passivated ILD layer. Substrate preparation 501 may include a pre-clean, or the patterning or other partial removal of an underlying layer. Deposition 502 of a-Si may include PVD from one or more Si targets at a power density of 2-3 $W/cm^2$. In some embodiments, the ambient may be oxygen-free to avoid parasitic oxidation of exposed superconducting structures. Optionally, hydrogen gas or a different H-containing gas may be added to the ambient during the Si deposition. The a-Si layer formed in step 502 may be the entire layer (300-1000 nm thick) or a sub-layer (50-300 nm thick).

Fluorine exposure 503 may include fluorine ions or radicals from a direct or remote plasma, a fluorine-containing carrier gas such as $NF_3$, or deposition of a thin fluorine-containing layer (e.g., CVD or ALD of $Si_3H_8$ with $NF_3$, or allowing a fluorine-containing material to adsorb to the surface). In some embodiments, such as the example in FIGS. 4A-4E, an additional a-Si deposition may optionally follow F exposure 503. F incorporation 504 may utilize the energy of plasma species or carrier-gas molecules impacting the surface of the a-Si, or the substrate may be heated to diffuse the F from the deposited or adsorbed layer. In some embodiments, the F may initially be trapped between successive layers of a-Si and later diffused into the a-Si by a stack anneal 506 (e.g., 300-350 C for 5-60 min at 20-60 Torr). Stack anneal 506 may also be included to repair any damage to the a-Si structure caused by more disruptive incorporation processes such as ion bombardment. Stack anneal 506 may be performed in the same chamber as one or more of the previous steps, or in a different chamber.

Figure 6:
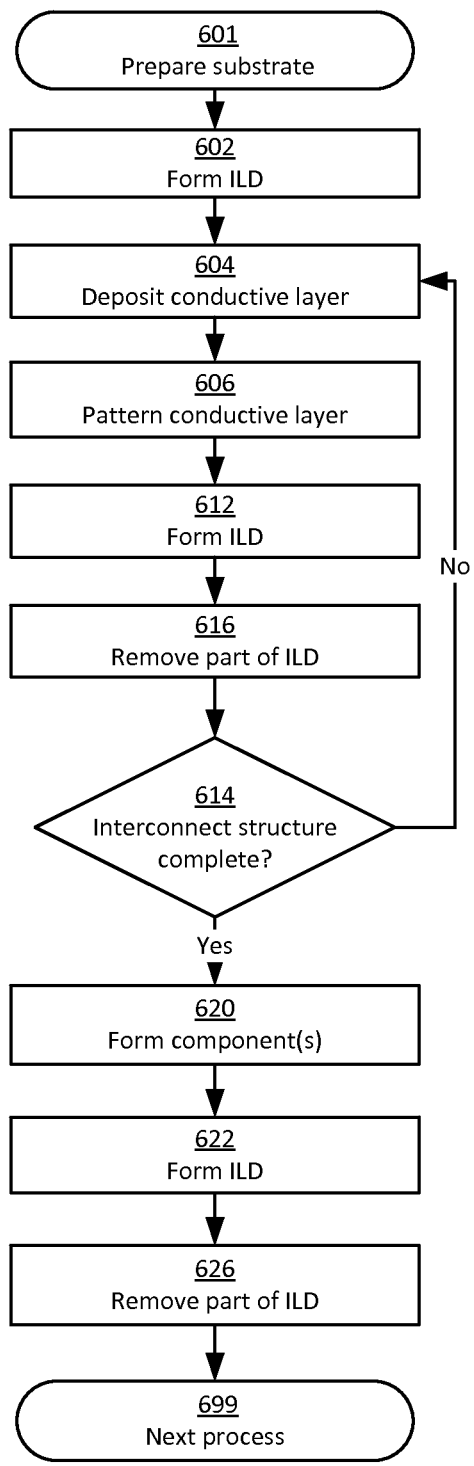
FIG. 6 is a flowchart of an example process for forming an interconnect structure.

FIG. 6 is a flowchart of an example process for forming an interconnect structure. Substrate preparation 601 may include a pre-clean or the formation of underlying layers or structures. ILD formation 602 may include a variation of the process of FIG. 5. Conductive-layer deposition 604 may be, for example, sputter deposition of a metal capable of superconductivity, such as Nb or Al. Conductive-layer patterning 606 may include etching the conductive layer to form wirings and/or vias. ILD formation 612 over the patterned conductive layer may include a variation of the process of FIG. 5. Removal 616 of part of the ILD layer, to allow connections to the structures below it, may include etching of openings or CMP. Steps 604-716 may be repeated to form additional interconnect levels. In some embodiments, intervening steps such as cleaning or annealing may be performed between any of the illustrated steps.

On completion 614 of the interconnect structure, one or more component layers may be added. Component formation 620 may include, for example, formation of superconducting Josephson junctions. The components may be formed over exposed (or otherwise accessible) connections to the underlying interconnect structure formed in steps 601-714. Optionally, one or more wirings and vias may be formed in the component layer. ILD formation 612 over the component layer may include a variation of the process of FIG. 5. Removal 626 of part of the ILD layer, to allow connections to the structures below it, may include etching of openings or CMP. Steps 604-716 may be repeated to form additional interconnect levels. In some embodiments, intervening steps such as cleaning or annealing may be performed between any of the illustrated steps.

Figure 7:
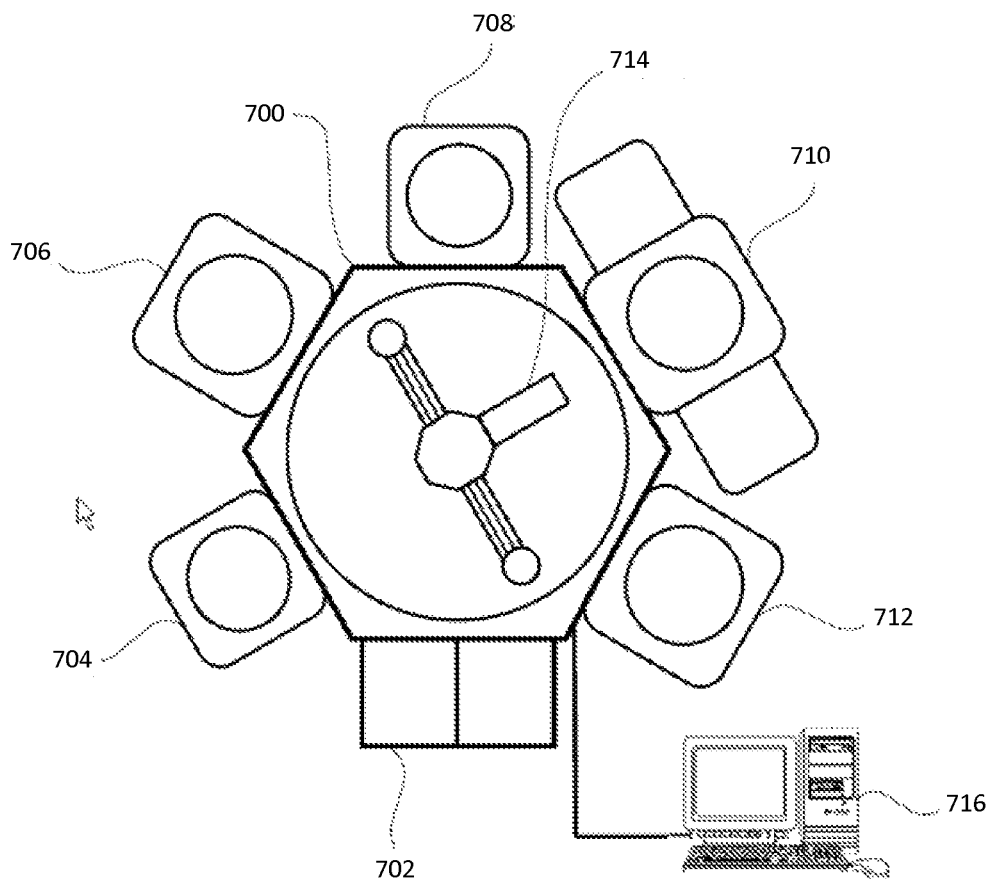
FIG. 7 is an example block diagram of a multi-chamber processing system with a shared controlled environment.

FIG. 7 is an example block diagram of a multi-chamber processing system with a shared controlled environment. A frame 300 supports multiple processing modules. Frame 300 may be a unitary frame enclosing a controlled environment. Within the controlled environment, substrates may be transferred between modules within the frame without exposure to ambient air or any other uncontrolled or unwanted ambient. Load lock/factory interface 302 provides access into the plurality of modules. Robot 314 provides for the movement of substrates (and masks) between the modules and into and out of load lock 302. Modules 304-312 may be any set of modules. For example, module 304 may be an orientation/degassing module, module 306 may be a plasma treatment module with direct or remote plasma capability, module 308 may be an ALD module, module 310 may be a PVD module, and module 312 may be a CVD module. One or more of the modules 304-312 may be capable of heating the substrate. In some embodiments, a centralized controller such as computing device 316 may control the processes, including the power supplies, substrate handling, plasma generating sources, liquid or gas inlets and exhausts, temperature controllers, and the like. This system is a non-limiting example of a system that can alternate, for example, PVD and plasma treatments or PVD and ALD or CVD depositions without exposing the substrate to uncontrolled ambient conditions.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method, comprising:
    providing a substrate, wherein a temperature of the substrate is less than about 350 C;
    forming a first superconducting layer on the substrate;
    forming a first amorphous silicon layer over the first superconducting layer;
    exposing the first amorphous silicon layer to a source of fluorine; and
    forming a second amorphous silicon layer over the first amorphous silicon layer;
    wherein the temperature of the substrate is less than about 350 C during each of the forming, forming, exposing, and forming steps;
    wherein the first amorphous silicon layer and the second amorphous silicon layer are formed by a process comprising physical vapor deposition.

2. The method of claim 1, wherein at least one of the first amorphous silicon layer or the second amorphous silicon layer is formed at a substrate temperature less than about 200 C.

3. The method of claim 1, wherein at least one of the first amorphous silicon layer or the second amorphous silicon layer is formed in an oxygen-free environment.

4. The method of claim 1, wherein at least one of the first amorphous silicon layer or the second amorphous silicon layer further comprises hydrogen.

5. The method of claim 1, wherein a thickness of at least one of the first amorphous silicon layer or the second amorphous silicon layer is between 50 nm and 300 nm.

6. The method of claim 1, wherein a thickness of at least one of the first amorphous silicon layer or the second amorphous silicon layer is greater than 300 nm.

7. The method of claim 1, wherein the source of the fluorine comprises a gas or a plasma-activated species.

8. The method of claim 1, wherein the source of the fluorine comprises at least one of fluorine ions, fluorine radicals, $NF_3$, or $F_2$.

9. The method of claim 1, further comprising forming a first interface layer over the first amorphous silicon layer before the second amorphous silicon layer is formed; wherein the first interface layer comprises the source of the fluorine.

10. The method of claim 9, wherein the first interface layer comprises adsorbed material.

11. The method of claim 9, wherein the first interface layer is formed by physical vapor deposition, chemical vapor deposition, or atomic layer deposition.

12. The method of claim 9, wherein a thickness of the first interface layer is between 0.1 nm and 10 nm.

13. The method of claim 1, wherein the first amorphous silicon layer is formed on the substrate at a first temperature, and further comprising heating the substrate to a second temperature higher than the first temperature after the first amorphous silicon layer is formed.

14. The method of claim 13, wherein the second temperature is between about 100 C and about 350 C.

15. The method of claim 13, wherein the heating is performed after the second amorphous silicon layer is formed.

16. The method of claim 1, wherein the fluorine is incorporated into the first amorphous silicon layer by impacts of ions or radicals on a surface of the first amorphous silicon layer.

17. The method of claim 1, wherein the substrate is kept in a controlled environment during the forming of the first amorphous silicon layer, the exposing of the first amorphous silicon layer to the source of fluorine, the incorporating of the fluorine into the first amorphous silicon layer, and the forming of the second amorphous silicon layer.

18. The method of claim 1, wherein the first superconducting layer comprises aluminum, niobium, a superconducting ceramic, or an organic superconductor.

19. A superconducting device, comprising:
    a structure, wherein the structure comprises a superconducting material; and
    an insulating layer in contact with the structure on at least one side;
    wherein the insulating region comprises amorphous silicon and fluorine; and
    wherein the fluorine is present in a bulk region of the insulating layer at least 40 nm from a surface of the insulating layer.

20. The superconducting device of claim 19, wherein a loss tangent of the insulating layer is less than 0.0002 at 200 GHz at an operating temperature of 0.1 Kelvin.

* * * * *